US006172575B1

(12) United States Patent
Shinmori

(10) Patent No.: US 6,172,575 B1
(45) Date of Patent: Jan. 9, 2001

(54) OSCILLATION CIRCUIT AND METHOD OF OBTAINING AN OSCILLATION SIGNAL

(75) Inventor: Nobuaki Shinmori, Miyazaki (JP)

(73) Assignee: Oki Electric Industry Co., Ltd., Tokyo (JP)

(*) Notice: Under 35 U.S.C. 154(b), the term of this patent shall be extended for 0 days.

(21) Appl. No.: 09/285,033

(22) Filed: Apr. 1, 1999

(30) Foreign Application Priority Data

Jun. 26, 1998 (JP) .................................................. 10-180259

(51) Int. Cl.[7] .............................. H03B 5/36; H03B 5/00
(52) U.S. Cl. .............................. 331/116 FE; 331/116 R; 331/183; 331/158
(58) Field of Search .............................. 331/116 FE, 158, 331/116 R, 183; 327/261, 264, 265

(56) References Cited

U.S. PATENT DOCUMENTS 4,387,350 * 6/1983 Bessolo et al. ................. 331/116 FE

FOREIGN PATENT DOCUMENTS 64-64403 * 3/1989 (JP).
2-122705 * 5/1990 (JP).
61-140204 * 12/1994 (JP).

* cited by examiner

Primary Examiner—Arnold Kinkead
(74) Attorney, Agent, or Firm—Jones Volentine, LLC

(57) ABSTRACT

An oscillation circuit includes an oscillation terminal, and an inverter which is coupled to the oscillation terminal and which outputs an oscillation signal according to a resonant frequency of a resonator to be connected to the oscillation terminal. The oscillation circuit also includes resistors having different resistance values, and a select circuit which sequentially operatively connects the resistors between the inverter and a voltage source in response to the oscillation signal.

19 Claims, 5 Drawing Sheets ary of the Invention
OSCILLATION CIRCUIT AND METHOD OF OBTAINING AN OSCILLATION SIGNAL

BACKGROUND OF THE INVENTION

1. Field of the Invention

The present invention generally relates to an oscillation circuit, more particularly, to an oscillation circuit having less current consumption and a method of obtaining an oscillation signal.

This application is a counterpart of Japanese patent application, Ser. No. 180259/1998, filed Jun. 26, 1998, the subject matter of which is incorporated herein by reference.

2. Description of the Related Art

In general, the operation of a semiconductor integrated circuit, such as a microcomputer, is controlled by a clock signal. Basically, the operating speed of an entire system which includes the microcomputer depends upon a frequency of the clock signal (clock rate). A crystal oscillation circuit having a CMOS type inverter is well known as an oscillation circuit which produces such a clock signal.

An example of a conventional oscillation circuit is shown in FIG. 5.

The oscillation circuit has oscillation terminals OSC0 and OSC1, a crystal resonator 1 (or a quartz resonator 1), a CMOS inverter 2 having a P-channel transistor TR1 and an N-channel transistor TR2, a set of capacitors C1 and C2, and a feedback resistor FR. Input and output terminals of the CMOS inverter 2 are respectively connected to the oscillation terminals OSC0 and OSC1. The oscillation circuit further includes current limiting resistors LR1 and LR2 which are connected to the CMOS inverter 2. The oscillation terminals OSC0 and OSC1, the feedback resistor FR, the CMOS inverter 2, and the current limiting resistors LR1 and LR are located inside a chip and the remaining elements are positioned outside the chip.

The current limiting resistors LR1 and LR2 limit an operating current to an appropriate amount while oscillating. Thus, a current consumption of the oscillation circuit can be reduced. Especially in the case where the resonant frequency of the crystal resonator 1 is relatively low, the current consumption can be substantially decreased by increasing a resistance of the current limiting resistors LR1 and LR2.

However, in the conventional oscillation circuit, a gain of the oscillation circuit decreases with increasing resistance of the resistors LR1 and LR2. Therefore, if a relatively large resistance is simply applied to the oscillation circuit having the crystal resonator 1 of a relatively high resonant frequency, it is not easy to achieve oscillation just after a power supply voltage is applied thereto. In fact, in this oscillation circuit, there is a possibility that oscillation is not achieved at all. On the other hand, if a relatively high resistance is simply applied to the oscillation circuit, there is a possibility that the oscillation circuit, which has the crystal resonator 1 of a relatively low resonant frequency, will exhibit an abnormal oscillation.

There are two ways to overcome this problem. One way is to prepare two kinds of oscillation circuits, one of which has resistors of relatively small resistance for a high frequency oscillation and the other of which has resistors of relatively large resistance for a low frequency oscillation. However, this reduces the mass production efficiency.

The other way is the so called mask option where extra masks are prepared to change resistors. However, this also reduces mass production efficiency.

Consequently, there has been a need for an improved oscillation circuit that may correctly oscillate at both low and high frequencies.

SUMMARY OF THE INVENTION

It is an object of the present invention to provide an oscillation circuit that may oscillate at both low and high frequencies.

It is an object of the present invention to provide an oscillation circuit that may reduce current consumption.

It is an object of the present invention to provide an oscillation circuit that has higher reliability with respect to an oscillation start up time.

It is another object of the present invention to provide an oscillation circuit which can be produced without using extra masks.

It is another object of the present invention to provide an oscillation circuit which may select appropriate resistors automatically.

According to one aspect of the present invention, for achieving the above object, there is provided an oscillation circuit for coupling with a resonator to produce an oscillating signal, which includes an oscillation terminal for connecting to the resonator, and an inverter which is coupled to the oscillation terminal and which outputs an oscillation signal according to a resonant frequency of a resonator. The oscillation circuit also includes resistors having respectively different resistance values, and a select circuit which sequentially operatively connects between the inverter and a voltage source in response to the oscillation signal.

The above and further objects and novel features of the invention will more fully appear from the following detailed description, appended claims and the accompanying drawings.

DETAILED DESCRIPTION OF THE PREFERRED EMBODIMENTS

An oscillation circuit according to the present invention will be explained hereinafter with reference to the figures.

Figure 1:
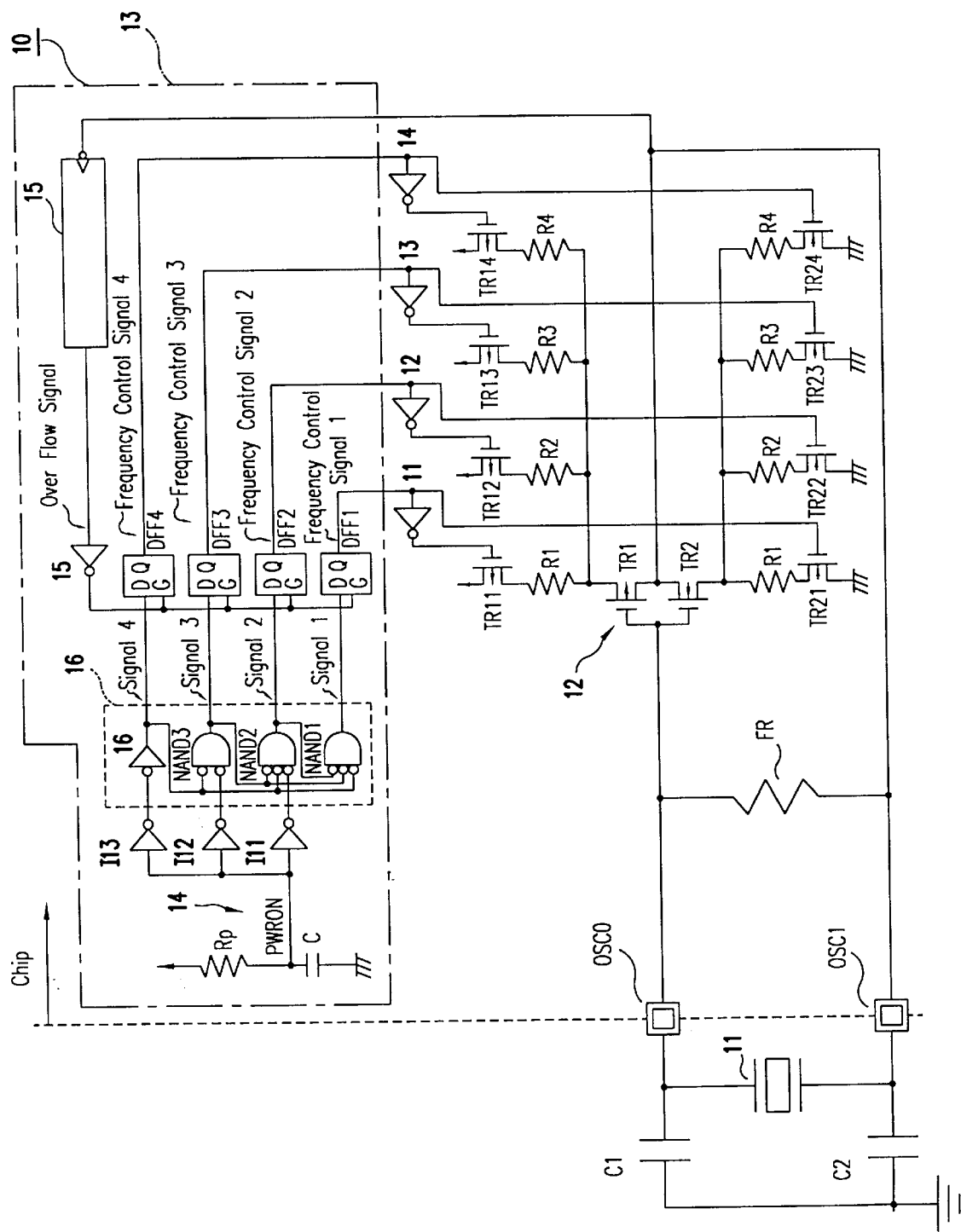
FIG. 1 is a circuit diagram showing an oscillation circuit according to a preferred embodiment of the present invention.

FIG. 1 is a circuit diagram showing an oscillation circuit according to a preferred embodiment of the present invention.

The oscillation circuit 10 has oscillation terminals OSC0 and OSC1, a crystal resonator 11 (or a quartz resonator 11), and a CMOS inverter 12 having an N-channel transistor TR1 and a P-channel transistor TR12. The CMOS inverter 12 (oscillation inverter) makes up an oscillation part. Input and output terminals of the CMOS inverter 12 are respectively connected to the oscillation terminals OSC0 and OSC1.

The oscillation circuit 10 also includes a set of capacitors C1 and C2, a feedback resistor FR, sets of current limiting resistors R1 through R4, P-channel transistors TR11 through TR14 and N-channel transistors TR 21 through TR24, and inverters I1 through I4.

The current limiting resistors are used to reduce the current consumption during oscillation. Each resistance of the resistors R1 through R4 is different from the others. The resistance of the resistor R1 is the smallest of them and the resistance of the resistor R4 is the largest of them (for example, the resistor R1 is approximately 10 ohm through 100 ohm, the resistor R4 is approximately 10 K ohm through 100 K ohm). The resistance of the resistor R3 is larger than those of the resistors R2 and R1, but is smaller than that of the resistor R4. The resistance of the resistor R2 is smaller than those of the resistors R3 and R4, but is larger than that of the resistor R1. The resistors R1 through R4 are automatically and sequentially connected (selected) to voltage sources (VCC or GND) according to states of switching transistors TR11 through TR24 which receive frequency control signals 1 through 4 from an oscillation frequency detect circuit 13. The resistor R1 is mainly used for a start-up time interval of oscillation because its resistance is relatively small so that the oscillation circuit can oscillate at a relatively high frequency. The resistor R4 is mainly used for a steady time period of oscillation because its resistance is relatively large so that the oscillation circuit can reduce the current consumption at a relatively low frequency. The resistor R2 and R3 are used for an intermediate time interval of oscillation.

For example, when the supply voltage is supplied to the oscillation circuit, the set of resistors R1 are connected to the voltage sources, and thereafter the resistors R2, R3 and R4 are connected in sequence. A detailed operation will be explained later.

The oscillation circuit further includes the oscillation frequency detect circuit 13 which automatically produces the frequency control signals 1 through 4 in response to a voltage level of the voltage source and an oscillation frequency (or in response to an oscillation start up time period just after supplying the supply voltage).

The oscillation frequency detect circuit 13 includes CR circuit 14 which is made up of resistor Rp and condenser C and which generates a PWRON signal that rises gradually after supplying the supply voltage, a counter 15 which counts an oscillation output signal of the CMOS inverter and outputs an over flow signal, and an inverter I5 which inverts the over flow signal from the counter 15.

The oscillation frequency detect circuit 13 also includes inverters I11 through I13, each of which has a different threshold voltage (Vt) and each of which inverts the PWRON signal when the voltage level of the PWRON signal reaches their respective threshold voltage level.

The oscillation frequency detect circuit 13 further includes a decode circuit 16. The decode circuit 16 is made up of an inverter I6, NAND gates NAND 1 through NAND 3. The inverter I6 inverts an output signal of the inverter I13 and output a signal 4. The NAND gate NAND 1 through NAND 3 respectively output signals 1 through 3 in response to outputs of the inverters I6, I11 through I12 and NAND gates themselves.

The oscillation frequency detect circuit 13 further includes latch circuits DFF1 through DFF4 which receive the signals 1 through 4 on respective data input terminals D and which latch the signals 1 through 4 in response to an output signal of the inverter I5 and thus output latched signals from latch output terminals Q as the frequency control signals 1 through 4.

As explained above, one of the particular elements of the oscillation circuit 10 according to the present invention is the current limiting resistors R1 to R4 which are connected to the CMOS inverter 12 as an oscillation part and which limit the operating current in sequence. Another particular element of the oscillation circuit 10 is the oscillation frequency detect circuit 13 which automatically outputs the frequency control signals 1 to 4 for selecting these current limiting resistors in response to the oscillation start up time period just after supplying the supply voltage. The oscillation frequency detect circuit 13 functions as an oscillation gain select circuit to provide an optimum gain to the oscillation circuit.

The transistors TR11 to TR 24 and the oscillation frequency detect circuit 13 operate as a select mechanism to select one set of current limiting resistors and to connect them between the CMOS inverter 12 and the voltage sources.

The inverters I11 to I13, the decode circuit 16 and the latch circuits DFF1 to DFF4 act as a control circuit to produce the frequency control signals 1 to 4 in response to the over flow signal and the signals 1 to 4 which correspond to the output of the CR circuit 14.

Next, the operation of the oscillation circuit 10 according to the present invention will be explained below.

Figure 2:
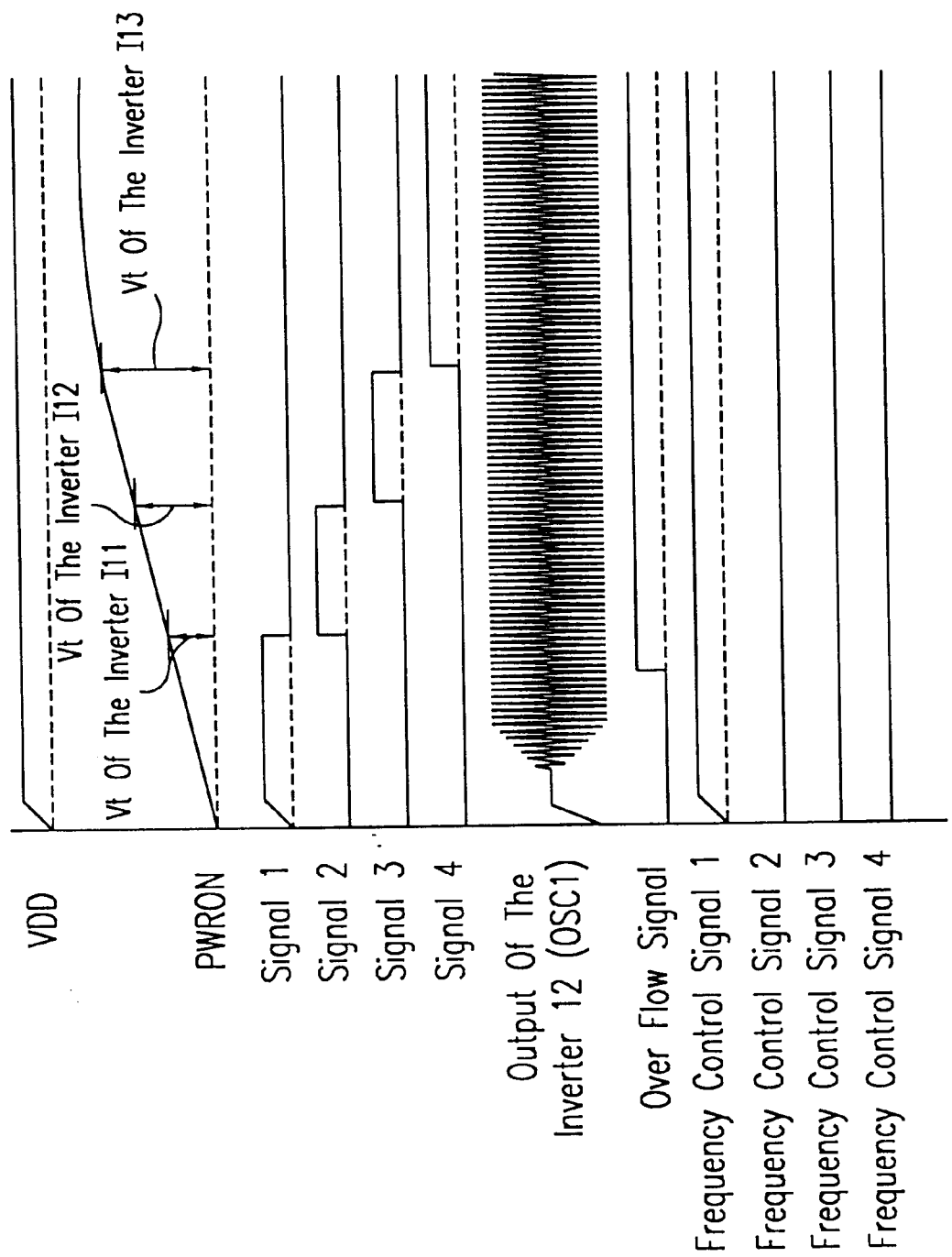
FIG. 2 is a timing chart showing an operation of an oscillation circuit according to a preferred embodiment of the present invention.
Figure 3:
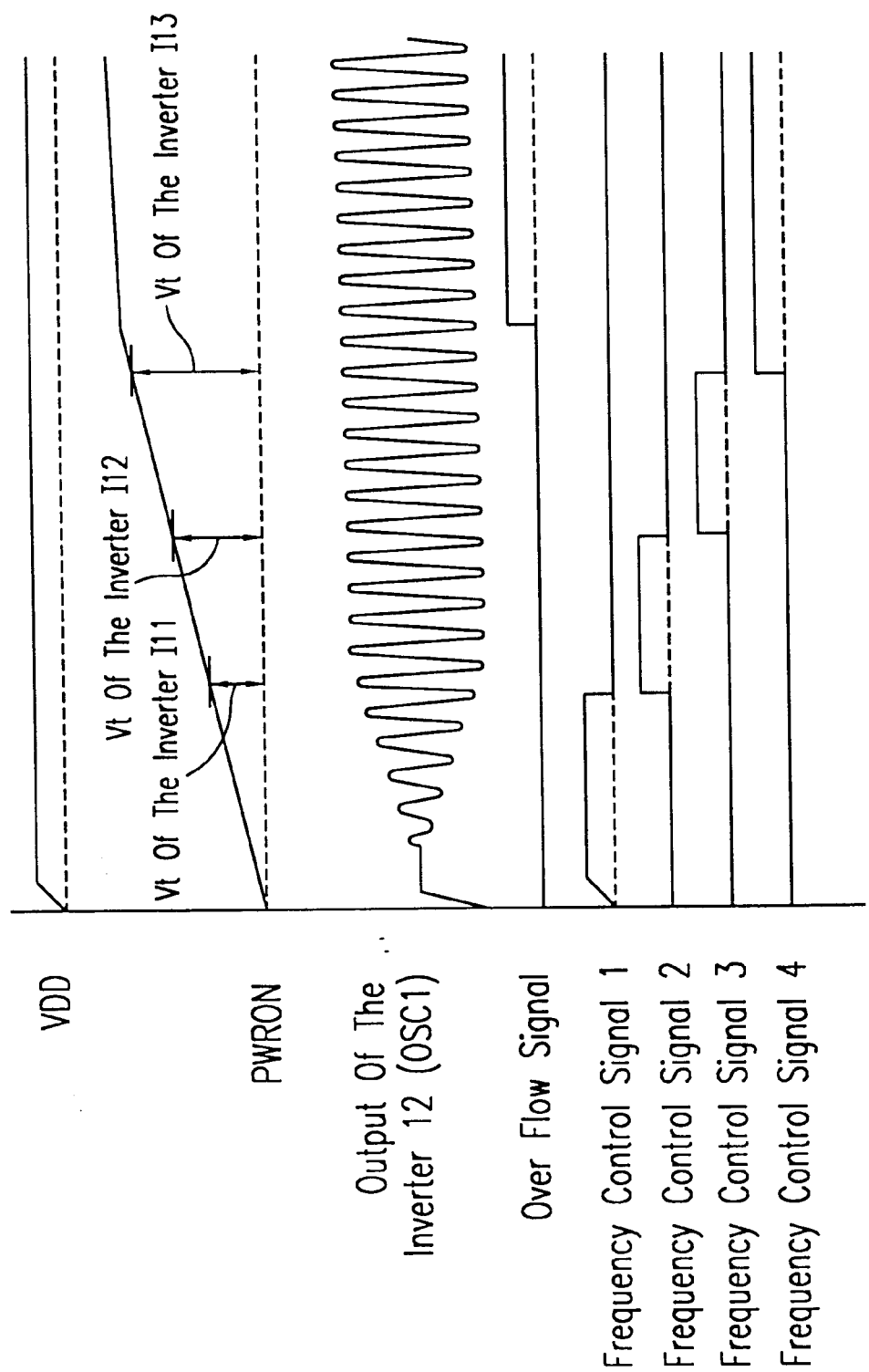
FIG. 3 is a timing chart showing an operation of an oscillation circuit according to a preferred embodiment of the present invention.

FIG. 2 and FIG. 3 are timing charts showing an operation of the oscillation circuit 10. FIG. 2 is a timing chart showing the case where the crystal resonator 11 having a high resonant frequency (for example, 10 MHz through several 10 MHz) is connected to the oscillation circuit 10. On the other hand, FIG. 3 is a timing chart showing the case where the crystal resonator 11 having a low resonant frequency (for example, 10 KHz through 100 KHz) is connected to the oscillation circuit 10.

(In the case of using the high resonant frequency.)

When the supply voltage VDD is applied to the oscillation circuit 10, PWRON signal rises gradually depending upon the delay time constant of the resistor Rp and the condenser C in the CR circuit. Now, the threshold voltage levels (Vt) of inverters I11 through I3 are set so that they are different from one another. That is, as illustrated in FIG. 2, the threshold voltage level (Vt) of the inverter I11 is the lowest of them, its level of the inverter I13 is the highest of them and its level of the inverter I12 is lower than that of the inverter I13 but is higher than that of the inverter I11. Therefore, each of the inverters I11 through I13 inverts the voltage level of the PWRON signal when the level of the PWRON signal reaches their corresponding threshold voltage levels. Then, these inverters outputs their output signals to the decode circuit 16.

The decode circuit 16 decodes the output signals of the inverters I11 through I13, which produces the signals 1 through 4, and which outputs these produced signals to the latch circuits DFF1 through DFF4. The voltage levels of the signals 1 through 4 change in sequence as illustrated in FIG. 2.

These signals 1 through 4 are transferred to the transistors TR 11 through TR 24 as the frequency control signals 1 through 4. These signals are latched by the latch circuits DFF1 through DFF4 when the over flow signal from the counter 15 is applied to these latch circuits. Once these latch circuits latch the signals 1 through 4, the voltage levels of the frequency control signals 1 through 4 do not change until the over flow signal becomes an inactive state.

For example, just after supplying the supply voltage VDD to the oscillating circuit 10, the latch circuit DFF1 outputs the frequency control signal 1 which has an H level corresponding to an H level of the signal 1. At this time, each of the latch circuits DFF2 through DFF4 outputs the frequency control signals 2 through 4 of L levels corresponding to the signals 2 through 4. Thereafter, when these latch circuits receive the over flow signal having the H level (the inverter I5's output signal having a L level), all latch circuits DFF1 through DFF4 latch the voltage levels applied thereto. Therefore, these voltage levels of the frequency control signals 1 through 4 are maintained. As a result, since the transistors TR11 and TR21 enter ON states, the CMOS inverter 12 with the set of resistors R1 functions as the oscillation part.

The counter 15 is designed so that it can count the output signal of the CMOS inverter 12 and can output the over flow signal when the count value reaches a predetermined value. The over flow signal is output to terminals G of the latch circuits through the inverter I5.

The over flow signal enables the latch circuit to latch. For example, in the case where using the crystal resonator 11 of the high resonant frequency, the count value counted by the counter 15 reaches the predetermined value in a short time. Accordingly, the over flow signal is output earlier compared to the case of using the crystal resonator 11 of the low resonant frequency.

FIG. 2 shows the case that the over flow signal of the H level has been already produced before the voltage level of the PWRON signal reaches the threshold voltage level of the inverter I11. As described above, in this case, since only the latch circuit DFF1 receives the signal 1 of the H level when the over flow signal having the H level is produced, only the frequency control signal 1 which is output to the transistors TR11 and TR21 becomes the H level. After that the voltage level of the over flow signal is kept constant. Therefore, even if the voltage level of the PWRON signal exceeds the threshold voltage levels of the inverters I12 and I13 and thus the voltage levels of the signals 1 through 4 are changed, the voltage levels of the frequency control signals 1 through 4 are not changed. As a result, the oscillation circuit 10 executes an oscillate operation by using the set of resistors R1.

The set of resistors R1 is used for the oscillation circuit 10 after supplying the voltage supply VDD, when using the crystal resonator 11 having the high resonant frequency. The reason for this is to obtain an advantage explained as follows.

When the resonant frequency of the crystal resonator is relatively high, there is a possibility that the oscillation is stopped just after starting because of the large resistance (because the gain is sufficiently low). In order to avoid such a problem, the present invention provides the oscillation frequency detect circuit 13 which can control the operation of the CMOS inverter 12 part so that the gain of the CMOS inverter 12 does not fall below a predetermined value after starting the oscillation. That is, since the set of resistors R1 having the smallest resistance are selected after starting oscillation, the oscillation circuit 10 can oscillate correctly.

(In the case of using the low resonant frequency.)

When the supply voltage VDD is applied to the oscillation circuit 10, the PWRON signal rises gradually depending upon the delay time constant of the resistor Rp and the condenser C in the CR circuit.

The decode circuit 16 decodes the output signals of the inverters I11 through I13 and outputs decoded signals to the latch circuits DFF1 through DFF4. The voltage levels of the signals 1 through 4 change in sequence as illustrated in FIG. 2.

Now, in this case, since the resonant frequency of the crystal resonator 11 is relatively low, the time when the count value counted by the counter 15 reaches the predetermined value is later than in the previous case. Accordingly, the over flow signal is output later compared to the case of using the crystal resonator 11 of the high resonant frequency. As a result, the operation of this case is different from that of the previous case as follows.

First, since the latch circuit DFF1 outputs the frequency control signal having the H level, the transistors TR11 and TR21 enter the ON state. Therefore, the set of resistors R1 is connected to the voltage sources (VDD and GND) and the CMOS inverter 12. As a result, the CMOS inverter 12 with the set of resistors R1 functions as the oscillation part.

Next, since the latch circuit DFF2 outputs the frequency control signal having the H level, the transistors TR12 and TR22 enter the ON state instead of the transistors TR11 and TR21. Therefore, the set of resistors R2 is connected to the voltage sources (VDD and GND) and the CMOS inverter 12. As a result, the CMOS inverter 12 with the set of resistors R2 functions as the oscillation part.

Next, since the latch circuit DFF3 outputs the frequency control signal having the H level, the transistors TR13 and TR23 enter the ON state instead of the transistors TR12 and TR22. Therefore, the set of resistors R3 is connected to the voltage sources (VDD and GND) and the CMOS inverter 12. As a result, the CMOS inverter 12 with the set of resistors R3 functions as the oscillation part.

At this time, the counter 15 does not output the over flow signal having the H level yet. Consequently, the oscillation circuit 10 continues to select the resistors.

Finally, since the latch circuit DFF4 outputs the frequency control signal having the H level, the transistors TR14 and TR24 enter the ON state instead of the transistors TR13 and TR23. Therefore, the set of resistors R4 is connected to the voltage sources (VDD and GND) and the CMOS inverter 12. As a result, the CMOS inverter 12 with the set of resistors R4 functions as the oscillation part.

Thereafter, the voltage level of the PWRON signal reaches the threshold voltage level of the inverter I13 and then the over flow signal of the H level is produced.

After that the voltage level of the over flow signal is kept constant until the counter 15 is disabled. Accordingly the voltage levels of the frequency control signals 1 through 4 are not changed. As a result, the oscillation circuit 10 executes an oscillation operation by using the set of resistors R4.

In the oscillation circuit 10, when the crystal resonator 11 having the low resonant frequency is used, the set of resistors R1 are used just after supplying the voltage supply VDD, and then the sets of resistors R2, R3 and R4 are used in sequence (in order of resistance value). The reason for this is to obtain an advantage explained as follows.

When the resonant frequency of the crystal resonator is relatively low, there is a problem that the current consumption becomes large during the oscillation. If the relatively large resistance simply is applied to the CMOS inverter 12, it is possible to avoid such current consumption problem. However, it is difficult to overcome the oscillation problem of the initial oscillation stage explained above. Furthermore, the oscillation circuit that can generate reference signals (clock signals) having a plurality of frequencies is needed for the modern microprocessor. Such an oscillation circuit is required to have a structure capable of producing different clock signals. Since the oscillation circuit 10 of the present invention can select appropriate resistors depending on the resonant frequencies in sequence while oscillating, it can satisfy this requirement.

(In the case of using an intermediate resonant frequency.)

A basic operation of this case is similar to those of the previous cases.

Figure 4:
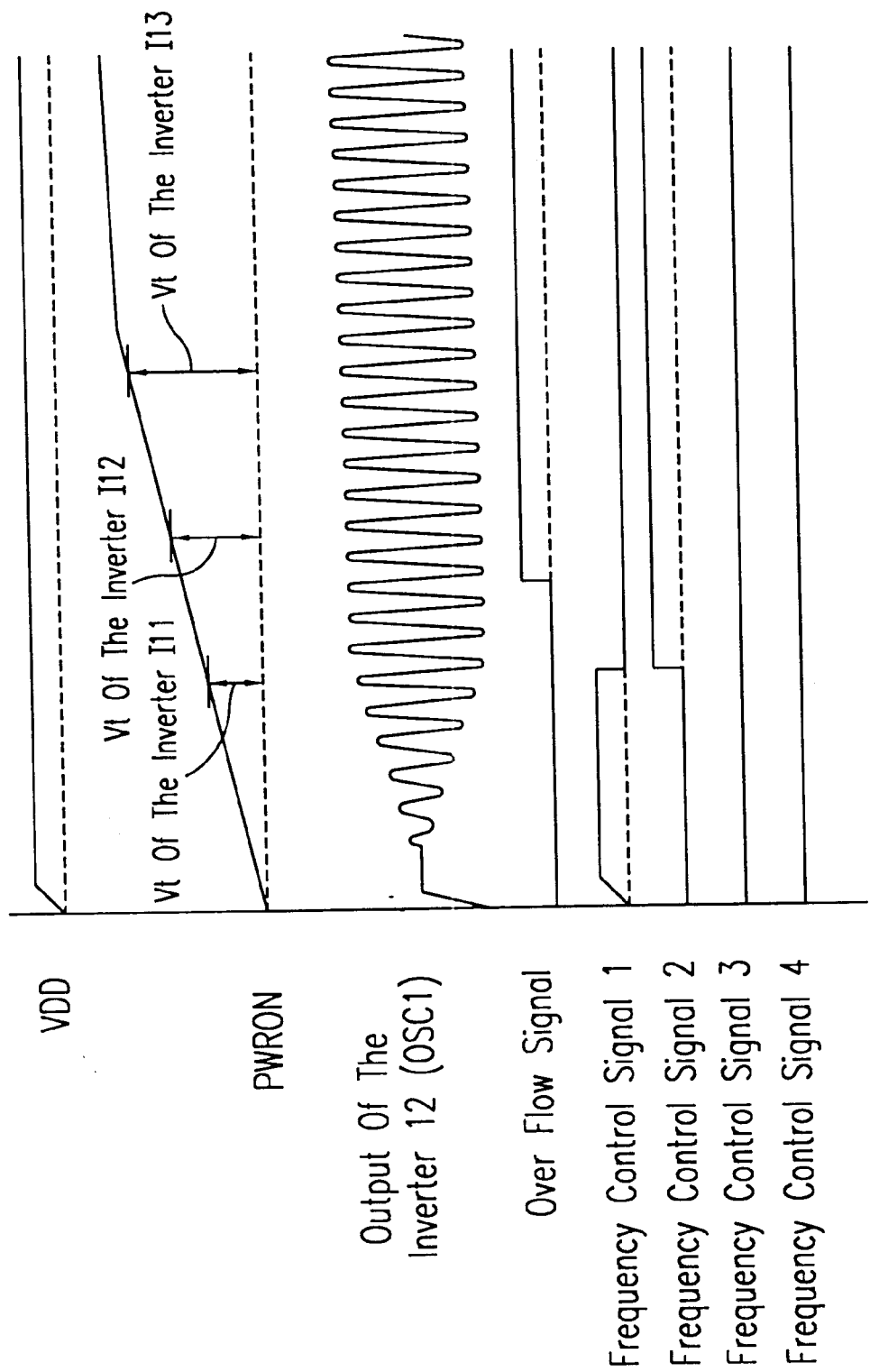
FIG. 4 is a timing chart showing an operation of an oscillation circuit according to a preferred embodiment of the present invention.
Figure 5:
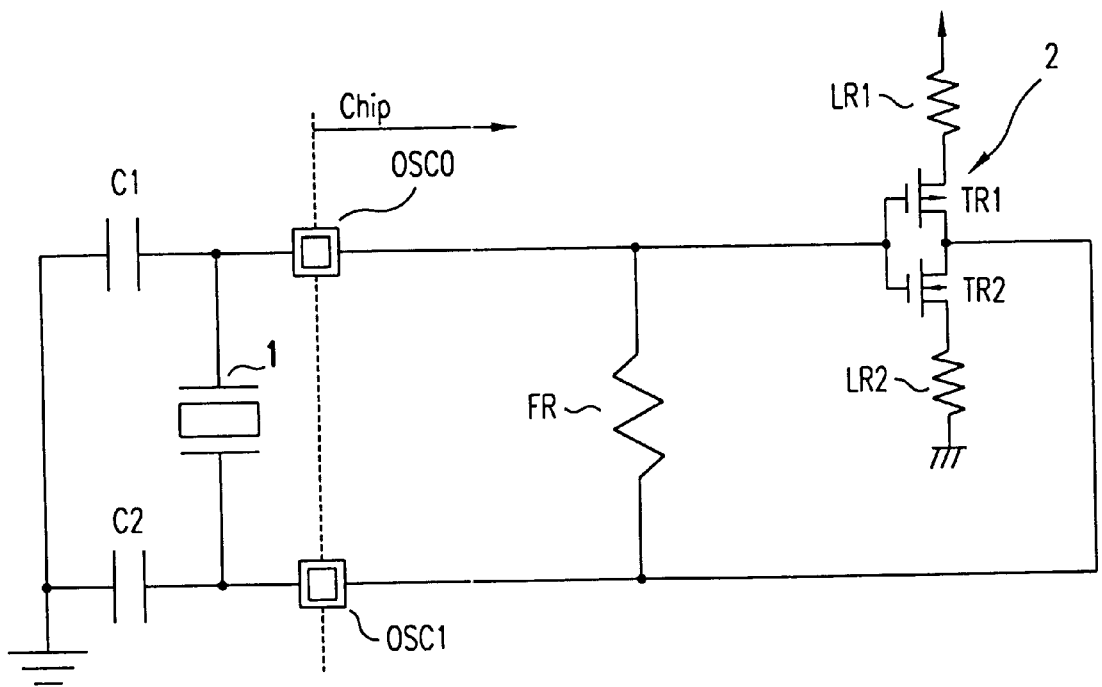
FIG. 5 is a circuit diagram showing a conventional oscillation circuit.

Referring to FIG. 4, when the supply voltage VDD is applied to the oscillation circuit 10, the PWRON signal rises gradually depending upon the delay time constant of the resistor Rp and the condenser C in the CR circuit.

The decode circuit 16 decodes the output signals of the inverters I11 through I13 and outputs decoded signals to the latch circuits DFF1 through DFF4. The voltage levels of the frequency control signals 1 through 4 change in sequence as shown in FIG. 4.

Now, in this case, since the resonant frequency of the crystal resonator 11 is an intermediate frequency, the time when the count value counted by the counter 15 reaches the predetermined value is later than that of the high frequency case but is earlier than that of the low frequency case. Accordingly, the over flow signal is output, for example, after the PWRON signal exceeds the threshold voltage level (Vt) of the inverter I11 and before it reaches the threshold voltage level (Vt) of the inverter I12.

As a result, the operation of this case is as follows.

First, since the latch circuit DFF1 outputs the frequency control signal having the H level, the transistors TR11 and TR21 enter the ON state. Therefore, these transistors make the set of resistors R1 connect to the voltage sources (VDD and GND). Consequently, the CMOS inverter 12 with the set of resistors R1 functions as the oscillation part.

At this time, since the counter 15 does not output the over flow signal having the H level yet, the oscillation circuit 10 continues to select the resistors.

Next, since the latch circuit DFF2 outputs the frequency control signal having the H level, the transistors TR12 and TR22 enter the ON state instead of the transistors TR11 and TR21. Therefore, these transistors make the set of resistors R2 connect to the voltage sources (VDD and GND). As a result, the CMOS inverter 12 with the set of resistors R2 functions as the oscillation part.

Thereafter, the voltage level of the PWRON signal reaches the threshold voltage level of the inverter I12 and then the over flow signal of the H level is generated.

After that the voltage level of the over flow signal is kept constant until the counter 15 is disabled. Accordingly, the voltage levels of the frequency control signals 1 through 4 are not changed. As a result, the oscillation circuit 10 executes an oscillation operation by using the set of resistors R2.

To summarize, when the oscillator circuit 10 uses the crystal resonator 11 having the intermediate resonant frequency, the set of resistors R1 are used just after supplying the voltage supply VDD and thereafter the set of resistors R2 are used.

According to the present invention, any crystal resonators may be connected to the oscillator terminals, because the oscillator circuit may automatically select appropriate current limiting resistors in response to their oscillation frequencies. This means that only one oscillation circuit is necessary to generate any of multiple oscillation frequencies. This also means that it is not necessary to provide the extra masks. This further means that it is not necessary to provide extra control signals for selecting appropriate current limiting resistors and extra terminals for them. (In the case of an oscillation circuit which is restricted the number of terminals, it can take advantage of this feature.) This further means that an appropriate oscillation and less current consumption can be achieved.

The oscillation circuit of the present invention can be utilized for an oscillation circuit part of an integrated circuit such as a microcomputer. Such integrated circuit using the present invention can obtain advantages as follows. It is possible to avoid increasing the number of control terminals, to attain higher reliability with respect to the oscillation start up time, and to reduce the current consumption. It is also possible to be used any resonators having a variety of oscillation frequencies. Note that the oscillator circuit 10 could be used in any devices having an inverter for oscillation.

The explanation of the oscillator circuit 10 and its particular configuration is intended to illustrate the principles of the present invention. It is not, however, to be construed as limitations on the present invention. For example, in the preferred embodiment, although the oscillator circuit 10 is shown to have the external crystal resonator, it is also possible to have the internal crystal resonator.

While the preferred form of the present invention has been described, it is to be understood that modifications will be apparent to those skilled in the art without departing from the spirit of the invention.

The scope of the invention, therefore, is to be determined solely by the following claims.

What is claimed is:

1. An oscillation circuit for coupling with a resonator to produce an oscillation signal, said oscillation circuit comprising:
   an oscillation terminal for connecting to the resonator;
   an inverter, coupled to said oscillation terminal, which outputs the oscillation signal according to a resonant frequency of the resonator;
   a plurality of resistors having respectively different resistance values; and
   a select circuit which sequentially operatively connects said plurality of resistors between said inverter and a voltage source in a sequence corresponding to the resistance values of said plurality of resistors in response to the oscillation signal.

2. An oscillation circuit as set forth claim 1, wherein the sequence is from smallest to largest resistance values of said plurality of resistors.

3. An oscillation circuit as set forth claim 1, wherein said select circuit comprises:
   a detect circuit which detects a voltage level of a voltage source and outputs a detected signal according to the voltage level of the voltage source;
   a counter, coupled to receive the oscillation signal, which counts the oscillation signal to output an over flow signal indicating that a corresponding count value has reached a predetermined value;
   a control circuit, coupled to said detect circuit and said counter, which outputs control signals in response to the detected signal, and which maintains a voltage level of the control signals in response to the over flow signal; and
   a plurality of switches, coupled in parallel between said inverter and the voltage source and coupled in series with said plurality of resistors, respectively, each of said plurality of switches being enabled in response to the control signal.

4. An oscillation circuit as set forth claim 3, wherein said control circuit outputs the control signals having voltage levels which change in sequence to enable each of said plurality of switches in sequence.

5. An oscillation circuit as set forth claim 3, wherein said control circuit comprises:
   a plurality of inverters, having respectively different threshold voltage levels, which receive the detected signal and respective output signals when the voltage level of the detected signal reaches the respective threshold voltage levels thereof; and
   a plurality of latch circuits, which receive respective signals output from the plurality of inverters, and which output the control signals and latch the control signals when the over flow signal is applied thereto.

6. An oscillation circuit as set forth claim 3, wherein said plurality of switches are MOS transistors each having a source electrode connected to the voltage source and a drain electrode connected to a respective one of said plurality of resistors.

7. An oscillation circuit as set forth claim 1, wherein said inverter is CMOS type inverter.

8. An oscillation circuit as set forth claim 1, wherein said oscillation terminal comprises an oscillation input terminal connected to an input terminal of said inverter said oscillation circuit further comprising:
   an oscillation output terminal connected to an output terminal of said inverter, wherein said oscillation input terminal and said oscillation output terminal are for connecting the resonator therebetween.

9. An oscillation circuit as set forth claim 8, wherein said resonator is a crystal resonator.

10. An oscillation circuit comprising:
    oscillation terminals;
    a resonator, coupled between said oscillation terminals, which has a resonant frequency;
    a CMOS inverter having an input terminal coupled to one of said oscillation terminals and an output terminal coupled to another of said oscillation terminals, which outputs an oscillation signal according to the resonant frequency of said resonator;
    a plurality of resistors having respectively different resistance values;
    a plurality of switches, coupled in parallel between said inverter and a voltage source and coupled in series to said plurality of resistors, respectively, each of said plurality of switches being enabled in response to respective frequency control signals;
    an oscillation frequency detect circuit which sequentially outputs the frequency control signals in response to the oscillation signal.

11. An oscillation circuit as set forth claim 10, wherein said oscillation frequency detect circuit outputs the frequency control signals having voltage levels which change in sequence to enable each of said plurality of switches in sequence.

12. An oscillation circuit as set forth claim 10, wherein said oscillation frequency detect circuit comprises:

a detect circuit which detects a voltage level of the voltage source and outputs a detected signal according to the voltage level of the voltage source;
   a counter, coupled to receive the oscillation signal, which counts the oscillation signal to output an over flow signal indicating that a corresponding count value has reached a predetermined value;
   a control circuit, coupled to said detect circuit and said counter, which outputs the frequency control signals in response to the detected signal, and which maintains a voltage level of the frequency control signals in response to the over flow signal.

13. An oscillation circuit as set forth claim 12, wherein said control circuit comprises:
   a plurality of inverters, having respective different threshold voltage levels, which receive the detected signal and respective output signals when the voltage level of the detected signal reaches the respective threshold voltage levels thereof; and
   a plurality of latch circuits, which receive respective signals output from the plurality of inverters, and which output the frequency control signals and latch the frequency control signals when the over flow signal is applied thereto.

14. An oscillation circuit as set forth claim 10, wherein said plurality of switches are MOS transistors each having a source electrode connected to the voltage source and a drain electrode connected to a respective one of said plurality of resistors.

15. An oscillation circuit as set forth claim 10, wherein said resonator is a crystal resonator.

16. A method of obtaining an oscillation signal using an oscillation circuit having an inverter, the method comprising:
    connecting a resonator to the inverter of the oscillation circuit;
    applying a supply voltage to the oscillation circuit such that the oscillation circuit starts to oscillate;
    detecting a voltage level of the supply voltage and generating control signals according to the voltage level of the supply voltage; and
    sequentially connecting resistors having respectively different resistance values between the inverter and the supply voltage in response to the control signals such that the oscillation signal is generated from the oscillation circuit.

17. A method as set forth claim 16, further comprising:
    counting the oscillation signal and outputting an over flow signal which is used to maintain voltage levels of the control signals.

18. A method as set forth claim 16, wherein said sequentially connecting comprises connecting the resistors in order from a smallest resistance value to a largest resistance value.

19. A method as set forth claim 16, wherein said sequentially connecting comprises connecting the resistors in a sequence corresponding to resistance values of the resistors.

* * * * *